(12) United States Patent
Shi et al.

(10) Patent No.: US 10,115,884 B2
(45) Date of Patent: Oct. 30, 2018

(54) FLEXIBLE DISPLAY

(71) Applicant: BOE Technology Group Co., Ltd., Beijing (CN)

(72) Inventors: Shiming Shi, Beijing (CN); Zhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 367 days.

(21) Appl. No.: 14/906,474

(22) PCT Filed: Jun. 3, 2015

(86) PCT No.: PCT/CN2015/080685
§ 371 (c)(1),
(2) Date: Jan. 20, 2016

(87) PCT Pub. No.: WO2016/115803
PCT Pub. Date: Jul. 28, 2016

(65) Prior Publication Data
US 2016/0372652 A1 Dec. 22, 2016

(30) Foreign Application Priority Data
Jan. 23, 2015 (CN) .......................... 2015 1 0036913

(51) Int. Cl.
*H01L 41/09* (2006.01)
*G02F 1/1333* (2006.01)
(Continued)

(52) U.S. Cl.
CPC ........ *H01L 41/0993* (2013.01); *G02F 1/1333* (2013.01); *G02F 1/1343* (2013.01); *G02F 1/133305* (2013.01); *G02F 1/134309* (2013.01); *H01L 41/0472* (2013.01); *H01L 41/0906* (2013.01); *H01L 41/0926* (2013.01); *H01L 41/193* (2013.01); *G02F 2202/022* (2013.01);
(Continued)

(58) Field of Classification Search
CPC ........................................................ H01L 41/09
USPC ........................................................ 310/800
See application file for complete search history.

(56) References Cited

U.S. PATENT DOCUMENTS 9,053,651 B2 * 6/2015 Yeo ........................... G09G 5/00
2013/0286462 A1 * 10/2013 Yeo ........................... G09G 5/00
359/291
2014/0306876 A1 10/2014 Lee et al.

FOREIGN PATENT DOCUMENTS

| CN | 1725067 A | 1/2006 |
| CN | 1864094 A | 11/2006 |

(Continued)

OTHER PUBLICATIONS

Nov. 23, 2016—(CN) First Office Action Appn 201510036913.3 with English Tran.
(Continued)

*Primary Examiner* — J. San Martin
(74) *Attorney, Agent, or Firm* — Banner & Witcoff, Ltd.

(57) ABSTRACT

A flexible display, including: a flexible display panel; an electroactive polymer layer disposed on a side of the flexible display panel that faces away from a displaying surface of the flexible display panel; and a first electrode layer and a second electrode layer which are disposed on the electroactive polymer layer. The electroactive polymer layer is capable of deforming according to the voltage applied across the first electrode layer and the second electrode layer.

13 Claims, 3 Drawing Sheets

(51) Int. Cl.
    *G02F 1/1343*     (2006.01)
    *H01L 41/047*     (2006.01)
    *H01L 41/193*     (2006.01)
    *H01L 27/32*     (2006.01)
    *H01L 51/00*     (2006.01)

(52) U.S. Cl.
    CPC ........ *H01L 27/3225* (2013.01); *H01L 41/098* (2013.01); *H01L 51/0097* (2013.01); *H01L 2251/5338* (2013.01)

(56) References Cited

FOREIGN PATENT DOCUMENTS

| | | |
|---|---|---|
| CN | 1961244 A | 5/2007 |
| CN | 102272959 A | 12/2011 |
| CN | 103416043 A | 11/2013 |
| CN | 103489380 A | 1/2014 |
| CN | 103545340 A | 1/2014 |
| CN | 103985338 A | 8/2014 |
| CN | 104536187 A | 4/2015 |
| CN | 204347389 U | 5/2015 |
| KR | 20100113869 A | 10/2010 |

OTHER PUBLICATIONS

Oct. 29, 2015—(WO)—International Search Report and Written Opinion Appn PCT/CN2015/080685 with English Tran.
May 12, 2017—(CN) Second Office Action Appn 201510036913.3 with English Tran.

\* cited by examiner

FLEXIBLE DISPLAY

The application is a U.S. National Phase Entry of International Application No. PCT/CN2015/080685 filed on Jun. 3, 2015, designating the United States of America and claiming priority to Chinese Patent Application No. 201510036913.3 submitted on Jan. 23, 2015. The present application claims priority to and the benefit of the above-identified applications and the above-identified applications are incorporated by reference herein in their entirety.

TECHNICAL FIELD

Embodiments of the present invention relate to a flexible display.

BACKGROUND ART

Liquid crystal display (LCD) technology has witnessed great achievement in terms of both screen size and display quality over the past decade. With the development of flexible display technology, flexible display products closer to traditional display modes will soon become popular. Flexible displays can bring a great deal of unique experience to users owing to their bendability.

SUMMARY OF THE INVENTION

Embodiments of the present invention provide a flexible display, comprising: a flexible display panel;
an electroactive polymer layer disposed on a side of the flexible display panel that faces away from a displaying surface of the flexible display panel; and
a first electrode layer and a second electrode layer which are disposed on the electroactive polymer layer;
wherein the electroactive polymer layer is capable of deforming according to an voltage applied across the first electrode layer and the second electrode layer.

In one embodiment, the first electrode layer and the second electrode layer are located on a side of the electroactive polymer layer that faces towards or away from the flexible display panel, and the first electrode layer and the second electrode layer are disposed in a same layer and spaced from each other. In one embodiment, an organic insulating layer is provided in a gap between the first electrode layer and the second electrode layer.

In one embodiment, the first electrode layer and the second electrode layer are located on different sides of the electroactive polymer layer, and the first electrode layer and the second electrode layer are oppositely disposed.

In one embodiment, the first electrode layer comprises a plurality of sub-first electrode layers spaced from each other with the sub-first electrode layers being parallel to and spaced from each other; and the second electrode layer comprises a plurality of sub-second electrode layers with the sub-second electrode layers being parallel to and spaced from each other.

In one embodiment, the plurality of sub-first electrode layers and the plurality of sub-second electrode layers are alternately arranged.

In one embodiment, each of the sub-first electrode layers is in a strip-like structure and each of the sub-second electrode layers is in a strip-like structure.

In one embodiment, the electroactive polymer layer comprises: a first sub-electroactive polymer layer formed of a swellable electroactive polymer material and/or a second sub-electroactive polymer layer formed of a contractile electroactive polymer material.

In one embodiment, the above flexible display further comprises: a flexible base substrate disposed between the flexible display panel and the electroactive polymer layer.

In one embodiment, the first electrode layer is a flexible electrode layer; and/or
the second electrode layer is a flexible electrode layer.

BRIEF DESCRIPTION OF THE DRAWINGS

In order to illustrate the technical solutions of the embodiments of the present invention more clearly, the drawings of the embodiments are simply described below. Apparently, the drawings described below relate to only some embodiments of the present invention but are not limitative of the present invention.

DETAILED DESCRIPTION

To make clearer the object, technical solutions and advantages of the embodiments of the present invention, a clear and full description of the technical solutions of the embodiments of the present invention will be made with reference to the accompanying drawings of the embodiments of the present invention. Obviously, the embodiments described are merely part of the embodiments of the present invention, but not all the embodiments. Based on the embodiments of the present invention described, all the other embodiments acquired by a person of ordinary skill in the art, without any creative labor, fall within the scope of protection of the present invention.

Unless otherwise defined, technical terms or scientific terms used herein shall be those within the general meaning understood by a person of ordinary skill in the field to which the present invention pertains. Throughout the description and claims of the application for a patent for invention, "first", "second" and similar words used therein do not denote any order, quantity or importance, but rather are used to distinguish different components. Likewise, "a", "an" or "the" and similar words do not denote quantitative limitation, but indicate the presence of at least one. "Comprising" or "comprises" and similar terms mean that the elements or objects preceding them are covered by the elements or objects and their equivalents listed thereafter, other elements or objects not being excluded. "Above", "below", and the like are only used to indicate the relative positional relationship, and when the absolute position of the object described changes, the relative positional relationship may change accordingly.

The inventors note that the flexible display can be bended or deformed only if an external force is applied thereto. Moreover, most of the structures applying external forces are mechanical control structures, for example, a retractable mechanism or a rotating mechanism.

Regardless of the mechanical structure being used, the overall volume and total weight of the display will be significantly increased due to the great weight and volume of the mechanical structure itself, which results in less convenience to carry a flexible display, thereby leading to poor portability.

Figure 1:
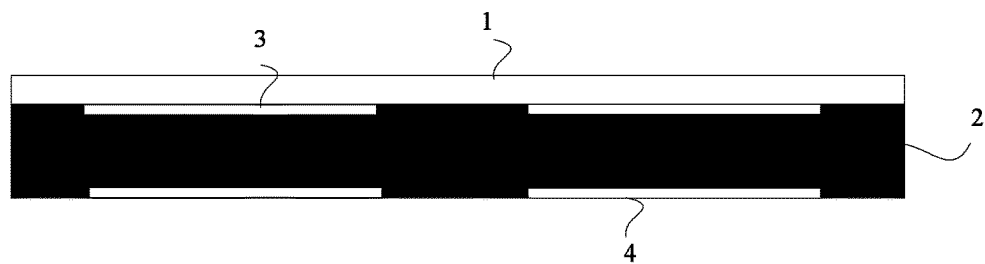
FIG. 1 is a schematic structural view of part of a first flexible display according to an embodiment of the present invention.
Figure 2:
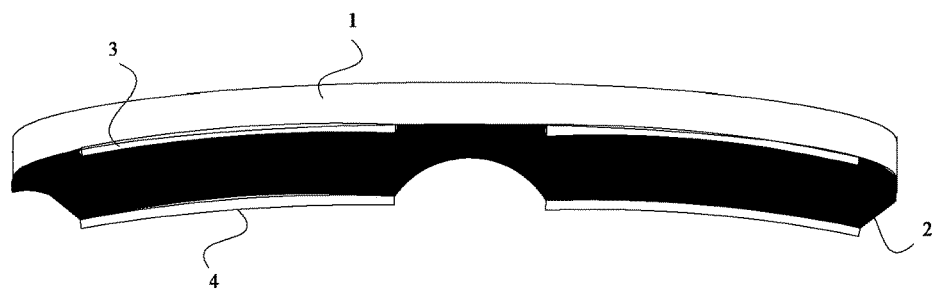
FIG. 2 is a schematic structural view of deforming of the first flexible display according to the embodiment of the present invention as shown in FIG. 1.

FIG. 1 is a schematic structural view of part of a first flexible display according to an embodiment of the present invention; FIG. 2 is a schematic structural view of the deformed first flexible display according to the embodiment of the present invention as shown in FIG. 1.

Embodiments of the present invention provide a flexible display, comprising: a flexible display panel 1;

an electroactive polymer layer 2 disposed on a side of the flexible display panel 1 that faces away from a displaying surface of the flexible display panel 1; and a first electrode layer 3 and a second electrode layer 4 disposed on at least one side of the electroactive polymer layer 2. When voltage is applied to both of the first electrode layer 3 and the second electrode layer 4, the electroactive polymer layer 2 will deform according to the voltage applied to the first electrode layer 3 and the second electrode layer 4.

The flexible display can be: any flexible product or component having a display function such as an LCD panel, electronic paper, an OLED panel, a mobile phone, a tablet computer, a TV set, a monitor, a laptop, a digital picture frame, a navigation system or the like.

With the flexible display provided in the embodiments of the present invention, the deformation thereof can be electrically controlled because the electroactive polymer layer tends to deform when voltage is applied thereto, which reduces the overall weight and volume of the flexible display compared with mechanical control.

The flexible display provided in the embodiments of the present invention is easy for bending control and easy to carry.

It should be noted that the above first electrode layer 3 and second electrode layer 4 are electrode layers with opposite polarity. That is to say, if the first electrode 3 is a positive electrode, then the second electrode layer 4 is a negative electrode; if the first electrode 3 is a negative electrode, then the second electrode layer 4 is a positive electrode.

The above first electrode layer 3 and the second electrode layer 4 may have the following various types of distributions and structures.

Figure 3A:
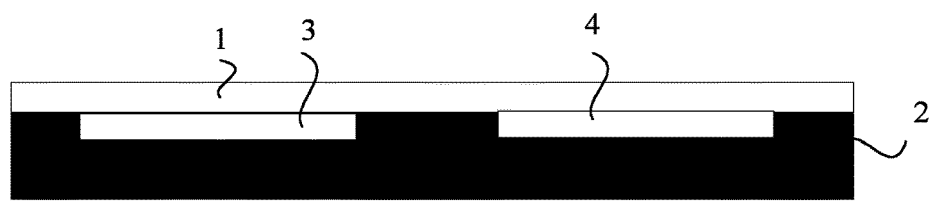
FIG. 3a is a schematic structural view of part of a second flexible display according to an embodiment of the present invention.
Figure 3B:
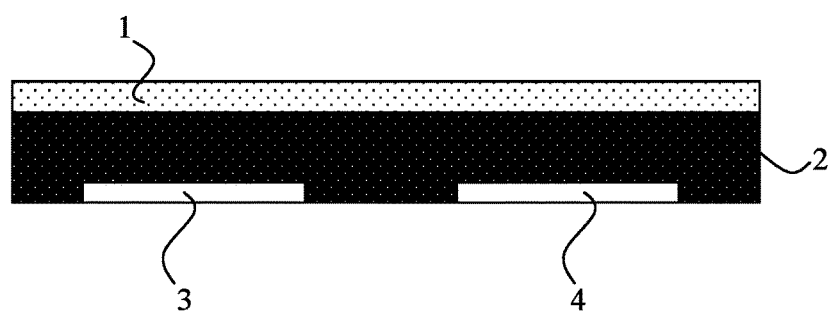
FIG. 3b is another schematic view of part of the structure of a second flexible display according to an embodiment of the present invention.

In one alternative embodiment, as shown in FIGS. 3a and 3b, FIGS. 3a and 3b are a schematic structural view of part of a second flexible display according to an embodiment of the present invention; the first electrode layer 3 and the second electrode layer 4 are located on a side of the electroactive polymer layer that faces towards or away from the flexible display panel, and the first electrode layer 3 and the second electrode layer 4 are disposed in a same layer spaced from each other. That is, the first electrode layer 3 and the second electrode layer 4 are located on a side of the electroactive polymer layer 2 that faces towards the flexible display panel 1 (FIG. 3a); alternatively, the first electrode layer 3 and the second electrode layer 4 are located on a side of the electroactive polymer layer 2 that faces away from the flexible display panel 1 (FIG. 3b).

In one alternative embodiment, an organic insulating layer is provided in a gap between the first electrode layer 3 and the second electrode layer 4.

In another alternative embodiment, as shown in FIG. 1, the first electrode layer 3 and the second electrode layer 4 are located on different sides of the electroactive polymer layer, and the first electrode layer 3 and the second electrode layer 4 are oppositely disposed. That is, the first electrode 3 and the second electrode 4 are disposed up and down.

Figure 4:
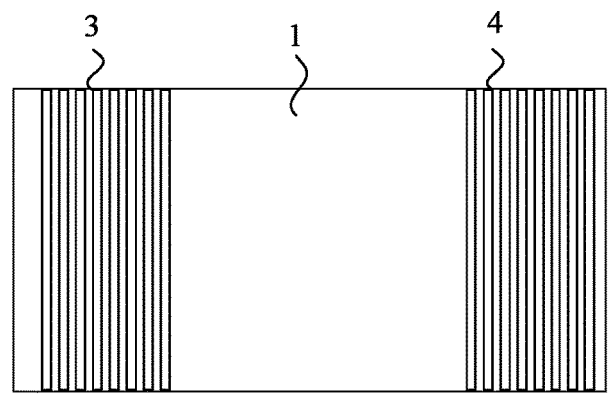
FIG. 4 is a schematic structural view of part of a third flexible display according to an embodiment of the present invention.

For example, as shown in FIG. 4, FIG. 4 is a schematic structural view of part of a third flexible display according to an embodiment of the present invention. In this embodiment, the first electrode layer 3 comprises a plurality of sub-first electrode layers disposed in a same layer with the sub-first electrode layers being parallel to and spaced from each other; the second electrode layer 4 comprises a plurality of sub-second electrode layers disposed in a same layer with the sub-second electrode layers being parallel to and spaced from each other. For example, as can be seen from the arrangement shown in FIG. 4, sub-first electrode layers are provided on the left side (in the direction as shown in the figure) of the flexible display panel 1 and sub-second electrode layers are provided on the right side (in the direction as shown in the figure) of the flexible display panel 1; when the first electrode layer and the second electrode layer are both electrified, the flexible display will bend from left to right or from right to left. The first electrode layer and the second electrode layer may also be arranged as follows: the sub-first electrode layer and the sub-second electrode layer are spaced from each other.

For example, a plurality of sub-first electrode layers and a plurality of sub-second electrode layers can be alternately arranged, i.e., a sub-first electrode layer, a sub-second electrode layer, and another sub-first electrode layer, which are alternately arranged as such.

In one alternative embodiment, each of the sub-first electrode layers is in a strip-like structure and each of the sub-second electrode layers is in a strip-like structure. The length and width of the strip can be set depending on requirement.

Electroactive polymers include two kinds: one kind of electroactive polymers has the function of contraction when voltage is applied thereto, and the other kind of electroactive polymers has the function of swelling when voltage is applied thereto. Based on the different characteristics of the above electroactive polymers, in order to realize bidirectional deformation control of the flexible display, in one alternative embodiment, the electroactive polymer layer comprises: a first sub-electroactive polymer layer formed of a swellable electroactive polymer material and/or a second sub-electroactive polymer layer formed of a contractile electroactive polymer material. That is, the electroactive polymer layer can be formed either of a swellable electroactive polymer material or of a contractile polymer material, or one part is formed of a swellable electroactive polymer material and another part is formed of a contractile electroactive polymer material.

Figure 5:
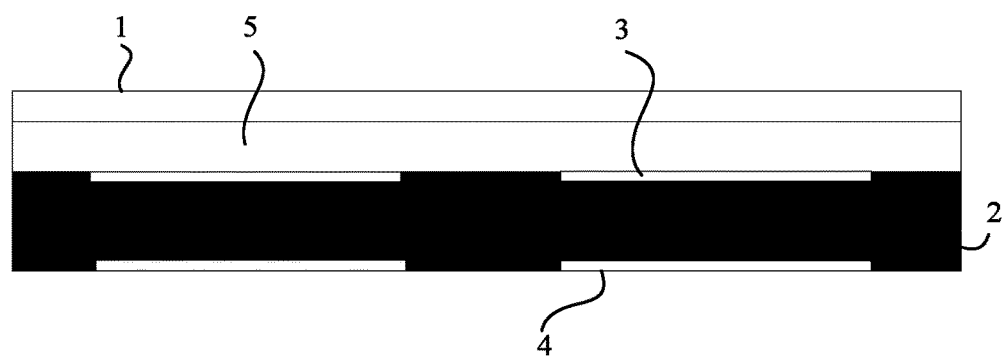
FIG. 5 is a schematic structural view of part of a fourth flexible display according to an embodiment of the present invention.
Figure 6:
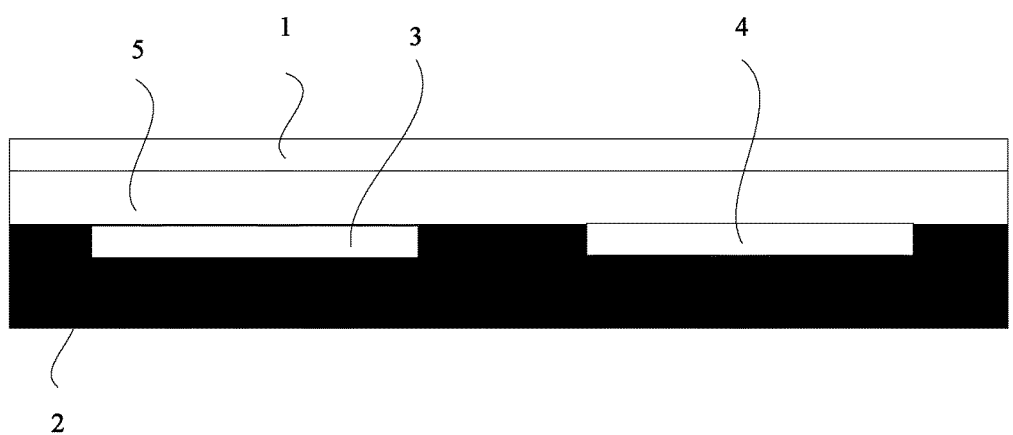
FIG. 6 is a schematic structural view of part of a fifth flexible display according to an embodiment of the present invention.

FIG. 5 is a schematic structural view of part of a fourth flexible display according to an embodiment of the present invention; FIG. 6 is a schematic structural view of part of a fifth flexible display according to an embodiment of the present invention. The above flexible display further comprises: a flexible base substrate 5 disposed between the flexible display panel 1 and the electroactive polymer layer 2.

That is to say, upon preparing a flexible display, one preparation method comprises: forming a first electrode layer and/or a second electrode layer by deposition on a side of the flexible display panel that faces away from a displaying surface of the flexible display panel, and forming an electroactive polymer layer on the first electrode layer and/or the second electrode layer; another preparation method comprises: first forming a first electrode layer and/or a second electrode layer by deposition on a flexible base substrate, then forming an electroactive polymer layer on the first electrode layer and/or the second electrode layer, and attaching the flexible base substrate provided with the first electrode layer and/or the second electrode layer as well as the electroactive polymer layer to a side of the flexible display panel that faces away from a light-exiting side of the flexible display panel.

In another alternative embodiment, in order to adapt to the deformation of the electroactive polymer layer, and avoid excessive deformation of the flexible display and damage of the first electrode layer and the second electrode layer, so as not to affect the performance of the entire flexible display, for example, the first electrode layer is a flexible electrode layer; and/or the second electrode layer is a flexible electrode layer.

The flexible display provided in the embodiments of the present invention has the character of tending to deform when voltage is applied thereto, the deformation thereof can be electrically controlled, which reduces the overall weight of the flexible display and therefore is easy to carry.

The above are merely exemplary embodiments of the present invention, and are not intended to limit the scope of protection of the present invention, which is yet determined by the appended claims.

The present application claims the priority of the Chinese patent application No. 201510036913.3 submitted on Jan. 23, 2015, and the content disclosed in the above Chinese patent application is incorporated herein by reference as part of the present application.

The invention claimed is:

1. A flexible display, comprising:
 a flexible display panel;
 an electroactive polymer layer disposed on a side of the flexible display panel that faces away from a displaying surface of the flexible display panel; and
 a first electrode layer and a second electrode layer which are disposed on the electroactive polymer layer;
 wherein the electroactive polymer layer is capable of deforming according to an voltage applied across the first electrode layer and the second electrode layer, and
 wherein the first electrode layer and the second electrode layer are located on a side of the electroactive polymer layer that faces towards or away from the flexible display panel, and the first electrode layer and the second electrode layer are disposed in a same layer and spaced from each other.

2. The flexible display according to claim 1, wherein an organic insulating layer is provided in a gap between the first electrode layer and the second electrode layer.

3. The flexible display according to claim 2, wherein the first electrode layer comprises a plurality of sub-first electrode layers spaced from each other with the sub-first electrode layers being parallel to and spaced from each other; and the second electrode layer comprises a plurality of sub-second electrode layers with the sub-second electrode layers being parallel to and spaced from each other.

4. The flexible display according to claim 2, wherein the electroactive polymer layer comprises: a first sub-electroactive polymer layer formed of a swellable electroactive polymer material and/or a second sub-electroactive polymer layer formed of a contractile electroactive polymer material.

5. The flexible display according to claim 1, wherein the first electrode layer and the second electrode layer are located on different sides of the electroactive polymer layer, and the first electrode layer and the second electrode layer are oppositely disposed.

6. The flexible display according to claim 5, wherein the first electrode layer comprises a plurality of sub-first electrode layers spaced from each other with the sub-first electrode layers being parallel to and spaced from each other; and the second electrode layer comprises a plurality of sub-second electrode layers with the sub-second electrode layers being parallel to and spaced from each other.

7. The flexible display according to claim 5, wherein the electroactive polymer layer comprises: a first sub-electroactive polymer layer formed of a swellable electroactive polymer material and/or a second sub-electroactive polymer layer formed of a contractile electroactive polymer material.

8. A flexible display, comprising:
 a flexible display panel;
 an electroactive polymer layer disposed on a side of the flexible display panel that faces away from a displaying surface of the flexible display panel; and
 a first electrode layer and a second electrode layer which are disposed on the electroactive polymer layer;
 wherein the electroactive polymer layer is capable of deforming according to an voltage applied across the first electrode layer and the second electrode layer; and the first electrode layer and the second electrode layer are respectively configured to connect to voltages of different polarities; and
 wherein the first electrode layer comprises a plurality of sub-first electrode layers spaced from each other with the sub-first electrode layers being parallel to and spaced from each other; and the second electrode layer comprises a plurality of sub-second electrode layers with the sub-second electrode layers being parallel to and spaced from each other.

9. The flexible display according to claim 8, wherein the plurality of sub-first electrode layers and the plurality of sub-second electrode layers are alternately arranged.

10. The flexible display according to claim 8, wherein each of the sub-first electrode layers is in a strip-like structure and each of the sub-second electrode layers is in a strip-like structure.

11. A flexible display, comprising:
 a flexible display panel;
 an electroactive polymer layer disposed on a side of the flexible display panel that faces away from a displaying surface of the flexible display panel; and
 a first electrode layer and a second electrode layer which are disposed on the electroactive polymer layer;
 wherein the electroactive polymer layer is capable of deforming according to an voltage applied across the first electrode layer and the second electrode layer; and
 wherein the electroactive polymer layer comprises: a first sub-electroactive polymer layer formed of a swellable electroactive polymer material and/or a second sub-electroactive polymer layer formed of a contractile electroactive polymer material.

12. The flexible display according to claim 11, further comprising: a flexible base substrate disposed between the flexible display panel and the electroactive polymer layer.

13. The flexible display according to claim 11, wherein the first electrode layer is a flexible electrode layer; and/or the second electrode layer is a flexible electrode layer.

* * * * *